(12) United States Patent
Lim

(10) Patent No.: US 7,283,012 B2  
(45) Date of Patent: Oct. 16, 2007

(54) TRI-STATE PULSE DENSITY MODULATOR

(75) Inventor: Meoung-Jin Lim, San Diego, CA (US)

(73) Assignee: Via Telecom., Ltd., San Diego, CA (US)

( * ) Notice: Subject to any disclaimer, the term of this patent is extended or adjusted under 35 U.S.C. 154(b) by 199 days.

(21) Appl. No.: 11/107,686

(22) Filed: Apr. 15, 2005

(65) Prior Publication Data

US 2006/0233234 A1  Oct. 19, 2006

(51) Int. Cl.
H03K 7/06 (2006.01)

(52) U.S. Cl. ............... 332/112; 332/113; 332/101; 332/106; 375/237; 341/126; 341/144

(58) Field of Classification Search ............ 332/112, 332/113, 106, 101; 375/237; 341/144, 126
See application file for complete search history.

(56) References Cited

U.S. PATENT DOCUMENTS

| | | | | |
|---|---|---|---|---|
| 4,742,329 A * | 5/1988 | Yamada et al. | ............. | 341/154 |
| 5,059,979 A * | 10/1991 | Micic et al. | ................. | 341/152 |
| 5,187,721 A * | 2/1993 | Wong | ......................... | 375/303 |
| 5,398,006 A | 3/1995 | Guntzburger et al. | .......... | 331/1 |
| 5,721,475 A * | 2/1998 | Fincher | ...................... | 318/599 |
| 5,995,546 A * | 11/1999 | Richardson | ................. | 375/237 |
| 6,459,398 B1 * | 10/2002 | Gureshnik et al. | .......... | 341/144 |
| 6,724,249 B1 | 4/2004 | Nilsson | ....................... | 330/10 |

* cited by examiner

*Primary Examiner*—Robert Pascal  
*Assistant Examiner*—Levi Gannon  
(74) *Attorney, Agent, or Firm*—Preston Gates & Ellis LLP.

(57) ABSTRACT

A tri-state pulse density modulator includes a first switch device coupled to a high voltage, and a second switch device coupled to a low voltage. An adder receives a pulse density modulation (PDM) input signal and a latched input signal to generate an output sum signal and a carry signal. A latch module coupled with the adder latches the output sum signal with a clock signal to generate the latched input signal. A control circuit module responsive to the carry signal for selectively turns off the first and second switch devices to generate the PDM output signal at a tri-state voltage between the first and second voltages, or turns on the first or second switch device to generate the PDM output signal at the first or second voltage, respectively. Thus, the PDM output signal only switches between the tri-state voltage and either the first voltage or the second voltage.

18 Claims, 5 Drawing Sheets

TRI-STATE PULSE DENSITY MODULATOR

BACKGROUND

The present invention relates generally to signal processing, and more particularly to the use of pulse density modulation circuits to convert digital signals into analog signals.

In electronic circuits, digital signals are commonly converted to analog signals using digital-to-analog converters (DACs). Conventional DACs, sometimes referred to as "static" DACs, receive and process digital input data using discrete hardware components to generate an analog signal that represents the digital input data. The voltage level of the analog signal varies according to the digital input signal. For example, a two-bit static DAC with a voltage range from zero to five volts provides an analog output from zero to five volts in increments based upon the value of an digital input word. As the number of bits in the digital input word increases, the size of the analog increments decreases. One of the problems with static DACs is that the discrete hardware components require a relatively large amount of space and consume a relatively large amount of power, making them unsuitable for applications that require compact, integrated solutions, such as personal communications services (PCS) devices.

One alternative to a static DAC is the "digital-based" DAC. In general, digital-based DACs require relatively less power and space than their static DAC counterparts, making digital based converters particularly well suited for small, integrated applications. Two modulation approaches used in digital-based DACs are pulse width modulation (PWM) and pulse density modulation (PDM).

PWM involves processing an N-bit input value to generate an analog signal with a voltage level that is proportional to the N-bit input value. A typical PWM modulator includes an N-bit counter, an N-bit comparator and a filter. The N-bit input value is applied to one of the comparator inputs. The output of the counter is applied to the other comparator input. The comparator compares the magnitude of the N-bit input value to the magnitude of the counter output to generate a single bit periodic signal.

A characteristic of PWM that presents some practical difficulties is that all of the logic HIGHs and LOWs ("1"s and "0"s) are contiguous within a modulation cycle. This characteristic is represented in the analog output as an AC component, which is often referred to as "ripple," typically expressed as a percentage of the logic HIGH voltage level. Ideally, the analog output is a constant DC value. However, because of the contiguous nature of the logic HIGHs and LOWs in the analog output, the analog output of a PWM modulator often contains AC ripple. The cutoff frequency of the filter is often lowered to attenuate ripple. However, this requires increasing the time constant of the filter, which can significantly increase the response time of the filter and in some cases cause instability in control loops, making it unsuitable for high speed applications.

In a pulse density modulation (PDM) system, it is the relative density of the pulses that correspond to the amplitude of the analog signal. In a PDM bitstream, a signal "1" corresponds to a pulse, while a signal "0" corresponds to an absence of a pulse. A run of all "1"s would result in a positive amplitude value, while a run of all "0"s would result in a negative amplitude value. Alternatively, a string of alternating "1"s and "0"s would correspond to a zero amplitude value. Thus, the bitstream actually looks like the wave it represents.

A PDM signal needs to be demodulated into an analog signal. Typically, the PDM digital bitstream is passed through an analog low pass filter that averages the signal. The density of pulses is then measured by the average amplitude of those pulses over time. As such, the decoding process only requires a low pass filter. PDM is similar to PWM except that the ripple in the analog output is characteristically lower than in a comparable PWM analog signal.

Although the PDM approach provides improved performance over the PWM approach, it has disadvantages. One of the problems with the conventional PDM circuit is that the conventional PDM output circuit requires a dedicated dead zone circuit to prevent shorts between VCC and GND during output switching. Also, the output has limited resolution due to the use of only two states in the output circuit (VCC and GND). Furthermore, the conventional PDM output switching circuit produces excessive switching noise which lowers the signal-to-noise ratio (SNR), and consumes unnecessary power especially at low output voltage levels due to the frequent switching between VCC and GND.

Therefore, what is desirable in the art of digital-based DAC designs are improved PDM DAC circuit designs that eliminate the need of a dead zone circuit, improved output resolution, SNR, switching noise and power consumption.

SUMMARY

This invention provides a tri-state pulse density modulator for generating a pulse density modulation (PDM) output signal. In one embodiment of the invention, the pulse density modulator includes a first switch device coupled to a first voltage, and a second switch device serially coupled between the first switch device and a second voltage that is lower than the first voltage. An adder receives the PDM input signal and a latched input signal to generate an output sum signal and a carry signal. A latch module coupled with the adder latches the output sum signal with a clock signal to generate the latched input signal. A control circuit module responsive to the carry signal selectively turns off the first and second switch devices to generate the PDM output signal at a tri-state voltage between the first and second voltages, or turns on the first or second switch device to generate the PDM output signal at the first or second voltage, respectively. A sign bit of the PDM input signal determines which switch device to select between the first switch and second switch. When the sign bit is positive, the first switch device is selected to turn on or off depending on the carry signal. When the sign bit is negative, the second switch is selected to turn on or off depending on the carry signal. As such, the PDM output signal only switches between the tri-state voltage and either the first voltage or the second voltage

DESCRIPTION

Figure 1:
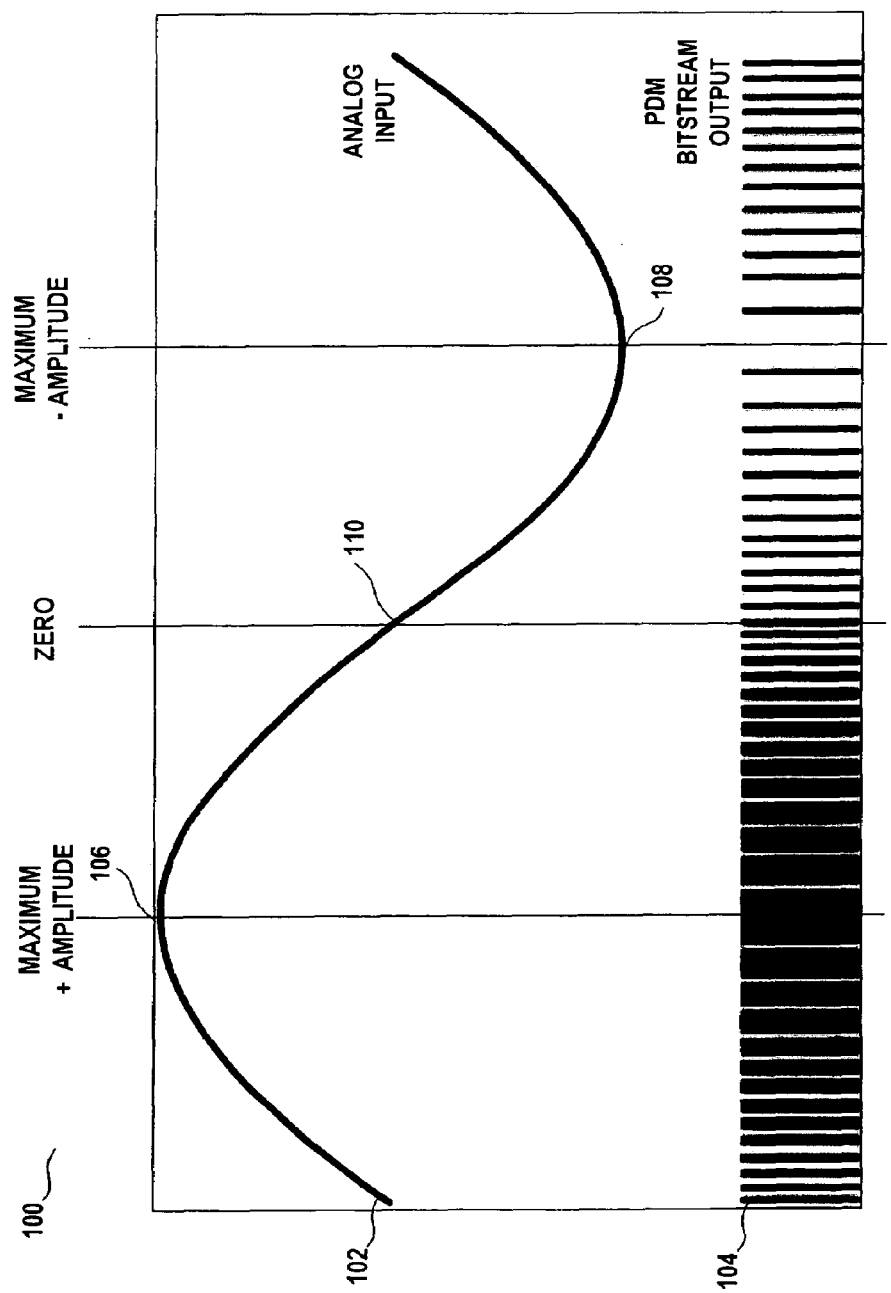
FIG. 1 illustrates a correlation of an analog signal with respect to a PDM bitstream.

FIG. 1 illustrates a graph 100 showing the correlation of an analog signal with respect to a PDM bitstream. The graph 100 shows the amplitude variations of one cycle of an analog signal 102 and the corresponding variations in pulse density of the PDM bitstream 104. It is noteworthy that at the maximum positive amplitude 106 of the analog signal, the PDM bitstream 104 has a run of all "1"s. At the maximum negative amplitude 108, the PDM bitstream has a run of all "0"s. The maximum number of alternating "1"s and "0"s occurs around the zero point 110. This is also the point where the most frequent switching between VCC and GND occurs. This occurrence generates a great amount of switching noise, power consumption, thereby a low SNR value.

Figure 2:
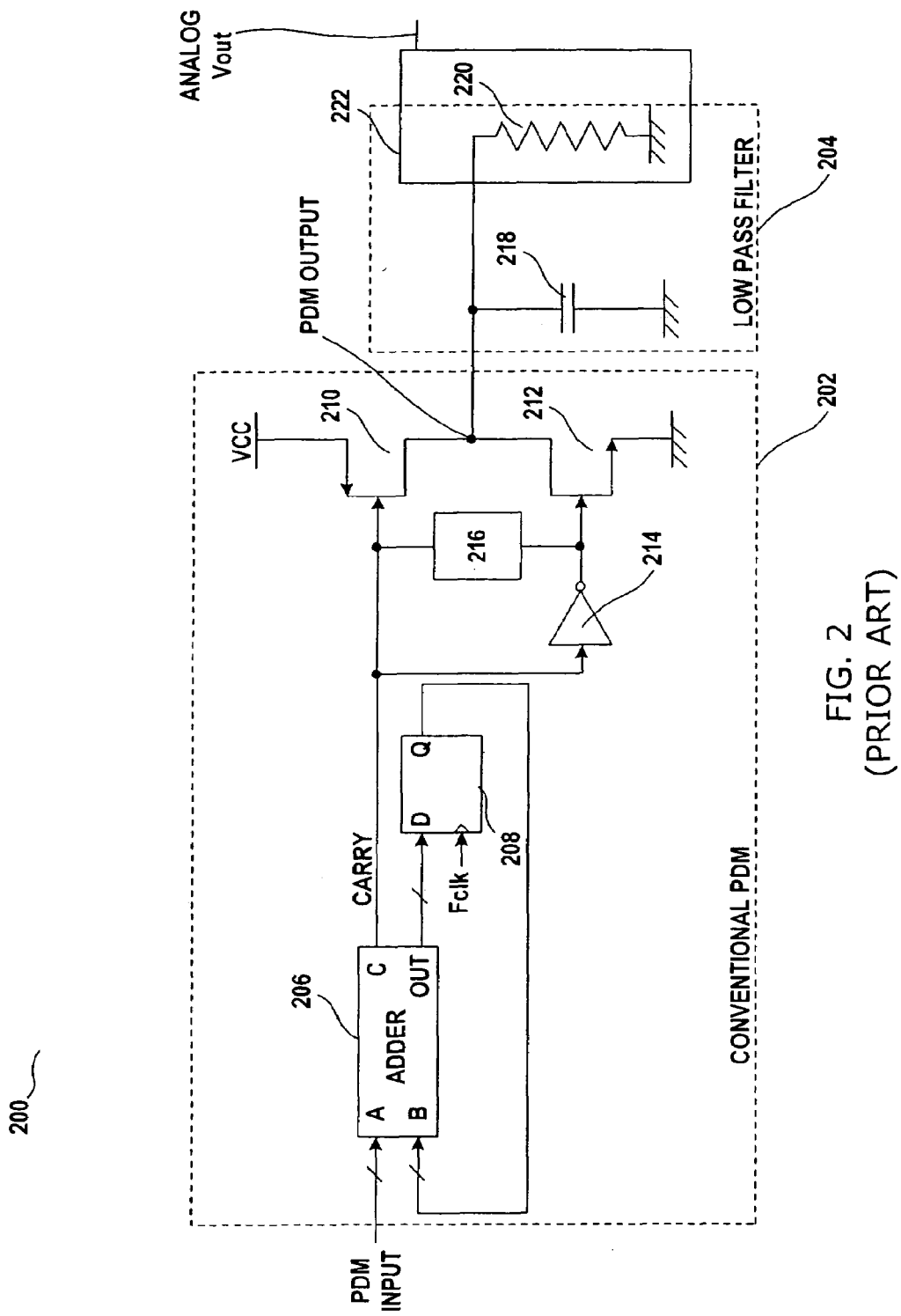
FIG. 2 illustrates a conventional PDM DAC circuit.

FIG. 2 illustrates a conventional PDM DAC 200 comprising a conventional pulse density modulator 202 coupled with a low pass filter 204 that functions as an integrator. A PDM input signal includes multiple parallel digital bits that are discrete voltages generated from a circuit, such as a microprocessor, memory, or other digital devices. The digital PDM input signal ranges from 0x0000 (representing 0V) to 0x7FFF (representing positive analog values up to the maximum plus amplitude) and from 0x0000 to 0x8000 (representing negative analog values up to the maximum minus amplitude), which will be shown in details in FIG. 3. An adder 206 having a number of adders coupled together in a parallel configuration receives the PDM input signal, and, in combination with a "D" flip-flop 208, generates a serial binary data stream on the carry line. The adder 206 and the "D" flip-flop 208 operate at a clock frequency (fclk). The adder sends an output sum signal to the D input of the flip-flop 208, which then provides a latched input signal to be fed back to the B input of the adder 206. The toggling carry signal on the carry line represents the parallel PDM input signal. When a carry bit of the carry signal is a "1," an PMOS switch device 210 is enabled (shorted) and an NMOS switch device 212 is disabled (open) by the inversion caused by an inverter 214, thereby providing a high voltage (VCC) as the PDM output signal. When the carry bit is a "0," the NMOS switch device 212 is enabled (shorted) and the PMOS switch device 210 disabled (open), thereby providing a low voltage (GND) as the PDM output signal. The PDM output signal is further processed by a low pass filter 204 that includes a capacitor 218 and a load resistor 220 to generate an analog signal representing the PDM input signal.

In this conventional PDM circuit, additional protection circuitry must be added to insure that the PMOS switch devices 210 and 212 are never both conducting at the same time. This circuit is known by those skilled in the art as a dead zone circuit 216. If both the PMOS switch devices 210 and 212 are allowed to conduct simultaneously, a VCC to GND short circuit occurs, which will distort the intended waveform of the PDM output signal.

Figure 3:
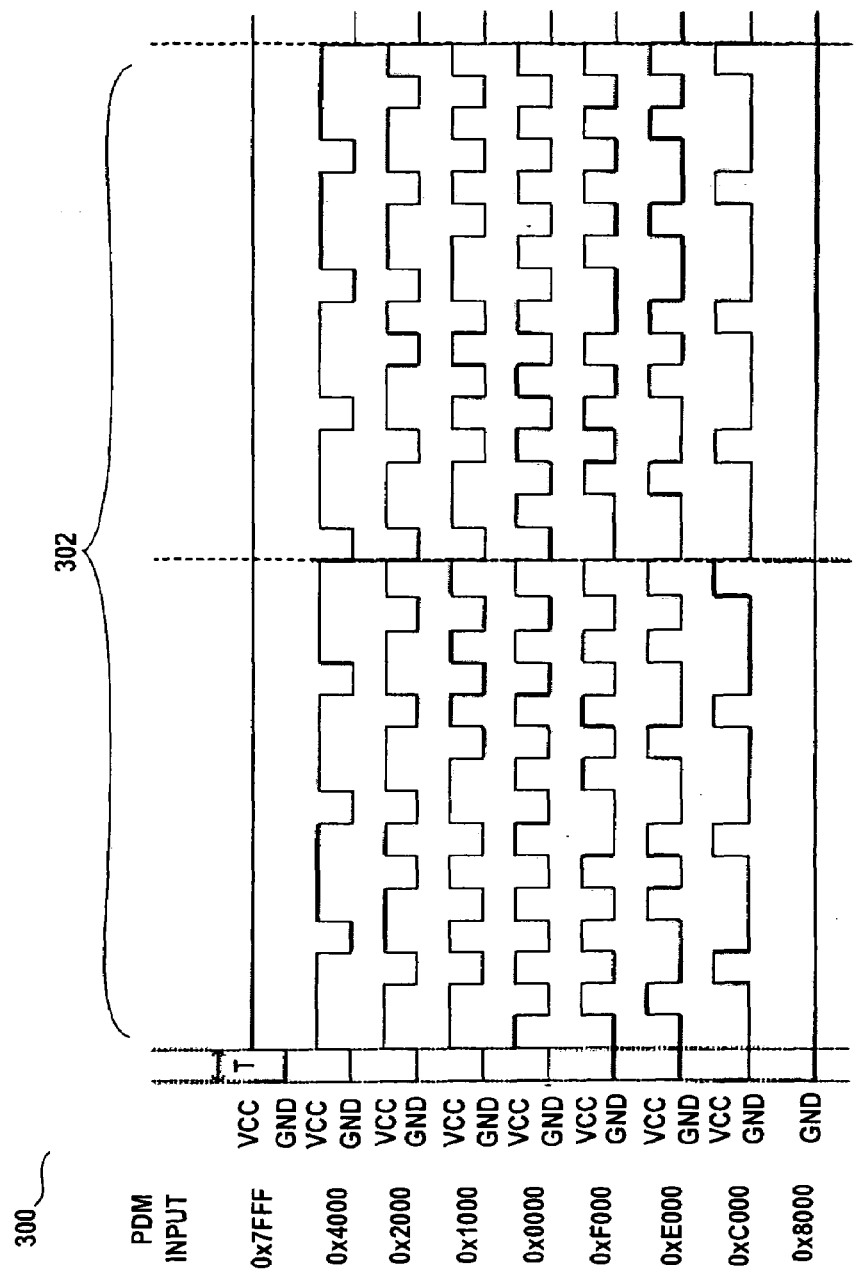
FIG. 3 illustrates the output waveforms for the conventional PDM DAC circuit.

The serial PDM output waveforms are shown in FIG. 3. At the PDM output point, the serial PDM binary waveform can be easily converted to an analog signal by passing the PDM waveform through the low pass filter 204 that averages the signal. Since the density of the pulses is measured by the average amplitude of those pulses over time, the decoding process only requires a low pass filter. In this example, the low pass filter 204 is comprised of a capacitor 218 to be coupled in parallel with a load (input) resistance 220, which is provided by an analog driver device 222. In other words, an output Vout of the analog driver device 222 is an analog representation of the parallel digital PDM input signal variations.

FIG. 3 illustrates a graph 300 of the output waveforms of the conventional pulse density modulator 202 versus the PDM input signal. As shown in the graph 300, PDM input value 0x7FFF, which represents the maximum plus amplitude, has a PDM output signal with of a run of all "1"s, or VCC. The PDM input value 0x8000, which represents the maximum minus amplitude, has a PDM output signal with a run of all "0"s, or ground voltage. As the PDM input signal gets smaller from the maxima, the PDM output signal switching between "1"s and "0"s becomes more frequent, until finally at 0x0000, whereat the PDM output signal alternates between "1"s and "0"s.

This frequent switching generates excessive power consumption, increases the switching noise, and decreases the SNR. Also, the conventional PDM has limited resolution since only two states, namely VCC and GND, are used for generating a pulse. Again, the dead zone circuit 216 is required such that the PMOS switch devices 210 and 212 will not conduct at the same time, thereby preventing any potential VCC-to-GND short circuit condition.

The following disclosure provides a tri-state PDM DAC circuit for eliminating the requirement for any dead zone circuit and improving the PDM's output resolution, SNR, switching noise and power consumption.

Figure 4:
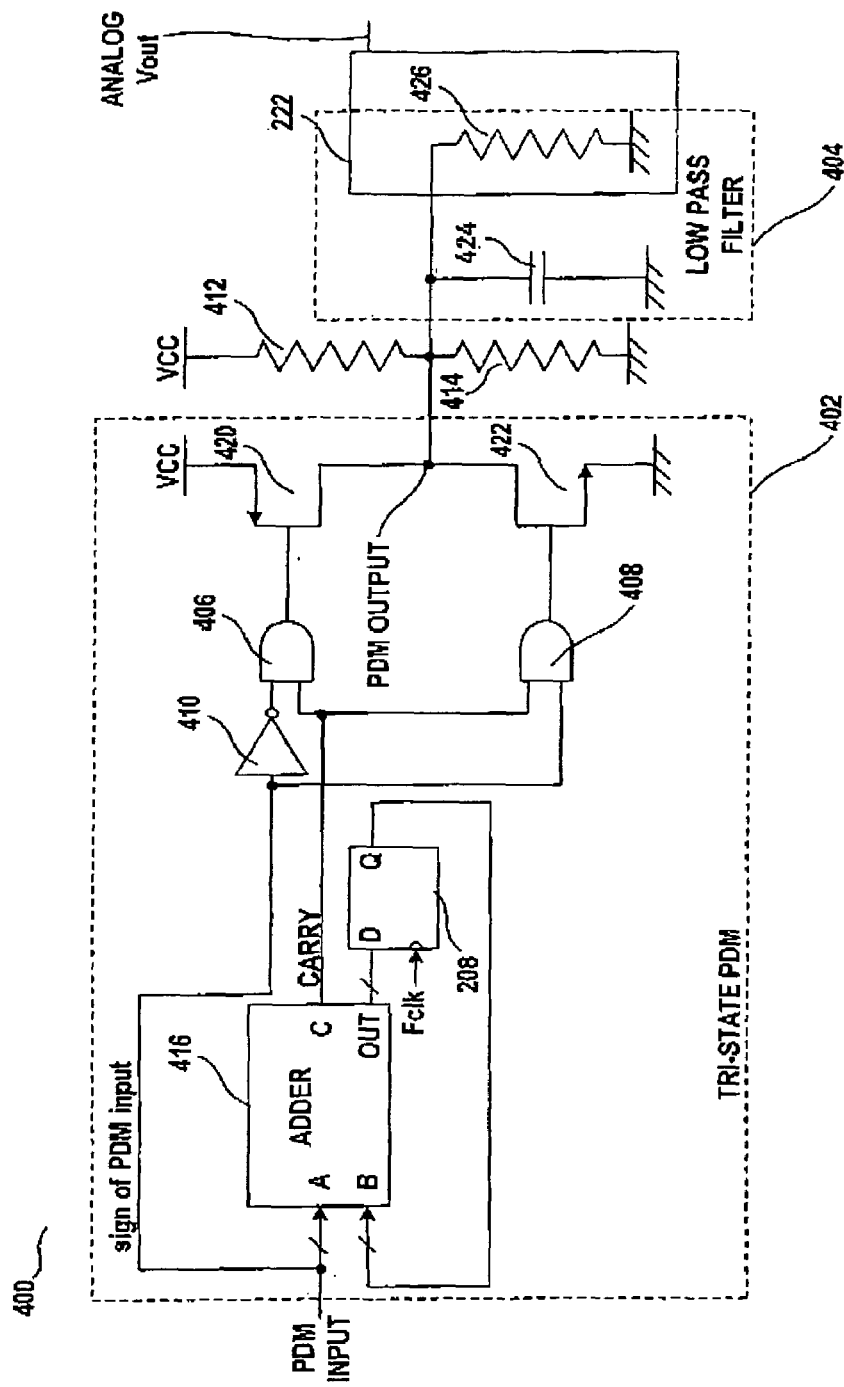
FIG. 4 illustrates a tri-state PDM DAC circuit according to one embodiment of the present invention.

FIG. 4 illustrates a new tri-state PDM DAC circuit 400 including a tri-state pulse density modulator 402 coupled with a low pass filter 404, in accordance with one embodiment of the present invention. An adder 416 having a number of adders coupled together in a parallel configuration receives the PDM input signal at node A, and a latched input signal at node B, and outputs a output sum signal at node OUT and a carry signal at node C. A latch circuit 418, such as a D flip-flop, coupled with the adder 416 receives the output sum signal at node D, which is latched with a clock Fclk to generate the latch input signal that is fed back to the node B of the adder 416. The frequency of Fclk is much faster than the sampling frequency of the PDM input signal. For example, if the sampling frequency of the PDM input signal is 48 KHz, the frequency of Fclk can be 1,000 times faster than the sampling frequency. The toggling carry signal on the carry line is a bitstream representing the parallel bits of the PDM input signal.

In this embodiment, the gate control signals for the PMOS switch devices 420 and 422 are provided by a control circuit module, collectively represented by AND gates 406, 408 and an inverter 410. The control circuit module responds to the carry signal and a sign bit to provide the gate control signals that allow the PMOS switch devices 420 and 422 to provide a tri-state mode. A tri-state output circuit provides not only two output states, namely VCC and GND, but also a tri-state voltage that falls between VCC and GND. The tri-state capability helps to eliminate the need of a dead zone control circuit, improves the PDM output resolution, decreases the power consumption, and increases the SNR value, as it will be further explained below.

The carry signal is routed to one input of each of two AND gates 406 and 408. The carry signal is gated through the AND gates 406 and 408 by the PDM input sign bit applied to the other input of the AND gates 406 and 408. The sign bit is a "0" for a positive value of the PDM output signal, and a "1" for a negative value of the same. A high or "1" sign bit enables the AND gate 408 and transfers the carry signal to the gate of the NMOS switch device 422. A low or "0" sign bit is inverted by the inverter 410 which enables the AND gate 406 and transfers the carry signal to the gate of the PMOS switch device 420. Therefore, the sign bit indicates the polarity of the ultimate analog output signal, and determines the pulse range of the waveform of the PDM output signal. For example, if the sign bit has a value "0," the pulse will range from the tri-state voltage to VCC, depending on the carry signal. If the sign bit has a value "1," the pulse will range from the tri-state voltage to GND, depending on the carry signal. Since this convention does not allow a PDM output signal at a connecting node of the PMOS switch devices 420 and 422 switching directly between VCC and GND, the possibility of the MOS switches 420 and 422 conducting at this same time is eliminated. Thus, a dead zone control circuit is not required. The carry signal determines whether the PDM output signal is in the tri-state, in which the PDM output signal is at an intermediate voltage level between VCC and GND as determined by resistors 412 and 414. The resistors 412 and 414 are serially coupled between VCC and GND. The connecting node between the resistors 412 and 414 is connected to the connecting point between the switch devices 420 and 422. The resistors 412 and 414 source or sink the current required by a resistor 426 respectively. The resistance values of resistors 412 and 414 can be different depending upon the source and sink load requirements. When the first and second switch devices 420 and 422 are turned off, the combination of the first and second resistors 412 and 414 maintains the PDM output signal at the intermediate, tri-state voltage at the connecting node thereof. In this embodiment, the values of resistors 412 and 414 are selected to maintain the PDM output at approximately half of VCC during the Hi-Z state. For example, the PDM output voltage during the HI-Z state can be calculated as:

$$\text{PDM output voltage} = (R_{414} \| R_{426}) / ((R_{412} + (R_{414} \| R_{426})) * VCC$$

The resistor 412 provides, or sources a current to the resistor 426, while the resistor 414 sinks a current from the resistor 426 at the Hi-Z state. The resistor 426 provides an amplifier input impedance in typical applications, which typically ranges from a few hundreds of kilo Ohms to a few mega Ohms. Therefore, the PDM output voltage during the HI-Z state will be about VCC/2 with proper selections of R412 and R414.

A truth table for the PDM output signal at a connecting node of the PMOS switch devices 420 and 422 is presented as follows:

| PDM INPUT SIGN BIT | CARRY | SWITCH 420 | SWITCH 422 | PDM OUTPUT |
|---|---|---|---|---|
| 0 | 0 | OPEN | OPEN | Tri-State |
| 0 | 1 | CLOSE | OPEN | VCC |
| 1 | 0 | OPEN | OPEN | Tri-State |
| 1 | 1 | OPEN | CLOSE | GND |

When the sign bit signal is logic "0" and the carry signal is logic "0," the control signals output from the AND gates 406 and 408 turn off the first and second switch devices 420 and 422, so that the PDM output signal is at the tri-state voltage. When the sign bit signal is logic "0" and the carry signal is logic "1," the control signals turn on the first switch device 420 and turn off the second switch device 422, so that the PDM output signal is at VCC voltage. When the sign bit signal is logic "1" and the carry signal is logic "0," the control signals turn off the first and second switch devices 420 and 422, so that the PDM output signal is at the tri-state voltage. When the sign bit signal is logic "1" and the carry signal is logic "1," the control signals turn off the first switch device 420 and turn on the second switch device 422, so that the PDM output signal is at GND. The PDM output signal now switches between VCC and the tri-state, or between GND and the tri-state. The PDM output signal can be further processed by a low pass filter 404 that includes a capacitor 424 and a load resistor 426 to generate an analog signal representing the PDM input signal.

Figure 5:
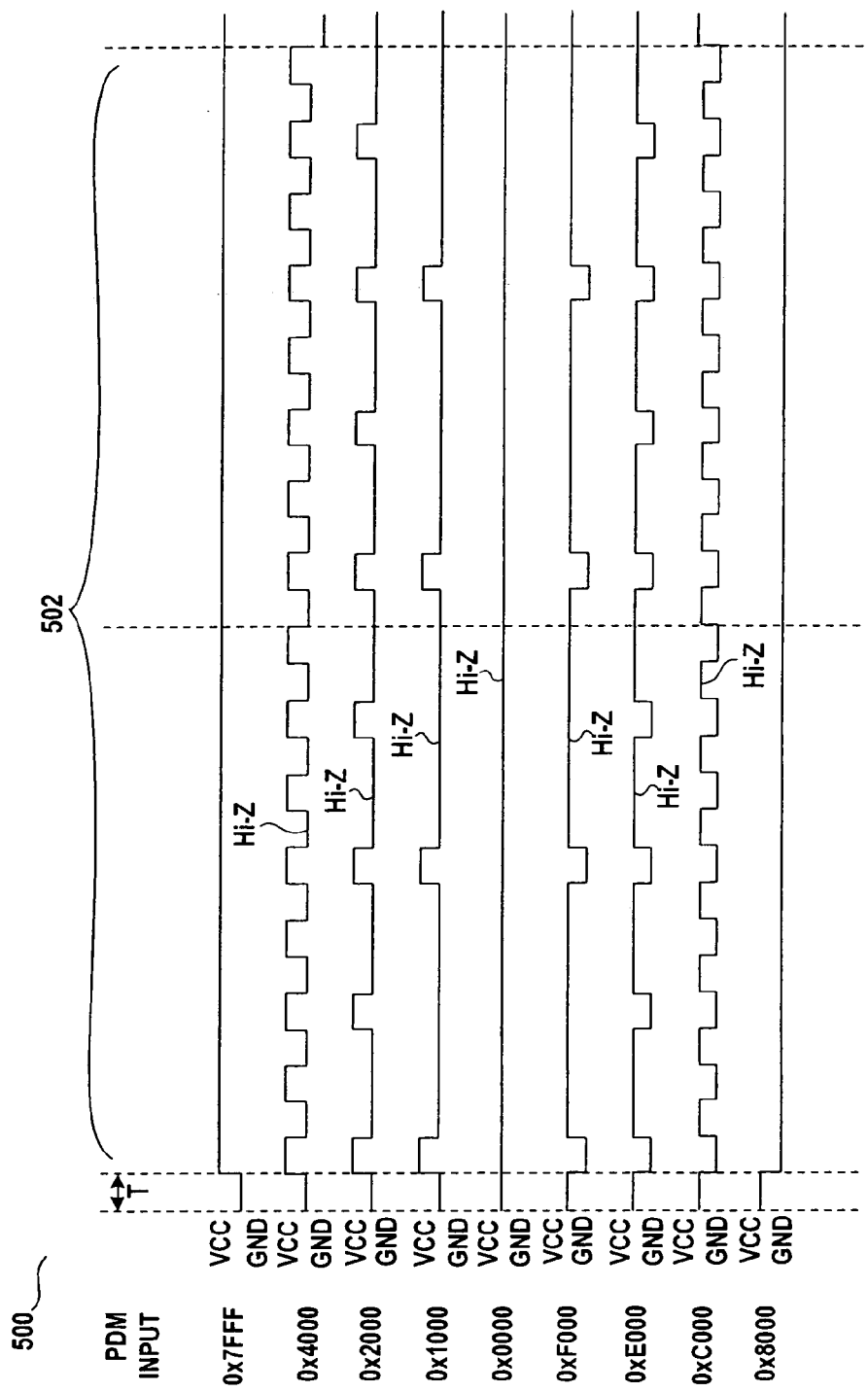
FIG. 5 illustrates the output waveforms for the tri-state PDM DAC circuit, according to the embodiment of the present invention.

FIG. 5 illustrates a graph 500 of the tri-state PDM DAC circuit 400 (as shown in FIG. 4) output waveforms versus PDM input. The PDM input signal is in a parallel binary bit format, sampled at a predetermined frequency. The PDM output waveforms 502 generated by the tri-state PDM DAC circuit 400 has a clock frequency (fclk) faster than the sampling frequency. As shown in the graph 500, the PDM input 0x7FFF has a PDM output signal with a of all "1"s, while the PDM input 0x8000 has a PDM output signal with a run of all "0"s (GND). It is noted that as the PDM input signal gets smaller from the maxima, the PDM output switching occurs between VCC and the tri-state voltage (Hi-Z) for all positive amplitudes, and between GND and the tri-state voltage (Hi-Z) for all negative amplitudes, until finally at 0x0000, whereat the PDM output is maintained at the Hi-Z.

In contrast to the conventional PDM circuit 202 (as shown in FIG. 2), the switching is both less frequent and at smaller amplitudes. In addition, the switching occurs between VCC and the Hi-Z state, or between GND and the Hi-Z state, and not between VCC and GND. This reduced voltage switching range decreases the power consumption of the PDM circuits, switching noise, and increases the SNR. The output resolution of the tri-state PDM DAC circuit 402 is increased by 3 db due to the three available output states (VCC, GND, and Hi-Z) instead of the two states (VCC and GND) for a conventional PDM circuit. Finally, no dead zone circuit is required for the tri-state PDM DAC circuit 202, since the PDM input sign bit insures that either VCC or GND, and not both, are selected.

The above illustration provides many different embodiments or embodiments for implementing different features of the invention. Specific embodiments of components and processes are described to help clarify the invention. These are, of course, merely embodiments and are not intended to limit the invention from that described in the claims. For example, as the power of electronic circuits are typically supplied by two complementary sources, whenever a VCC and GND combination is mentioned above, it can also be a VCC and VSS combination depending on particular circuit designs.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A tri-state pulse density modulator for generating a pulse density modulation (PDM) output signal, comprising:
    an adder for receiving a PDM input signal and a latched input signal to generate an output sum signal and a carry signal;

a latch module coupled with the adder for latching the output sum signal with a clock signal to generate the latched input signal;
a first switch device coupled to a first voltage;
a second switch device serially coupled between the first switch device and a second voltage that is lower than the first voltage; and
a control circuit module responsive to the carry signal for selectively turning off the first and second switch devices to generate the PDM output signal at a tri-state voltage between the first and second voltages, or turning on the first or second switch device to generate the PDM output signal at the first or second voltage, respectively, so that the PDM output signal only switches between the tri-state voltage and either the first voltage or the second voltage.

2. The tri-state pulse density modulator of claim 1 wherein the first and second switch devices are a PMOS transistor and an NMOS transistor, respectively.

3. The tri-state pulse density modulator of claim 2 further comprising a sign bit received by the control circuit module for determining if the PDM output signal switches between the tri-state voltage and the first voltage, or between the tri-state voltage and the second voltage.

4. The tri-state pulse density modulator of claim 3 wherein the control circuit module comprises a first AND gate having an output node connected to the gate of the second switch device, and a first input node receiving the carry signal and a second input node receiving the sign bit.

5. The tri-state pulse density modulator of claim 3 wherein the control circuit module comprises an inverter for receiving the sign bit and outputting a reversed sign bit.

6. The tri-state pulse density modulator of claim 5 wherein the control circuit module further comprises a second AND gate having an output node connected to the gate of the first switch device, and a first input node receiving the carry signal and a second input node receiving the reversed sign bit.

7. The tri-state pulse density modulator of claim 1 further comprising a first resistor and a second resistor serially coupled between the first voltage and the second voltage, a connecting node between the first and second resistors being connected to a connecting node between the first and second switch devices, thereby maintaining the PDM output signal at the tri-state voltage when the first and second switches are turned off.

8. A tri-state pulse density modulator for generating a pulse density modulation (PDM) output signal, comprising:
an adder for receiving the PDM input signal and a latched input signal to generate an output sum signal and a carry signal;
a latch module coupled with the adder for latching the output sum signal with a clock signal to generate the latched input signal;
a first switch device coupled to a first voltage;
a second switch device serially coupled between the first switch device and a second voltage that is lower than the first voltage; and
a control circuit module responsive to the carry signal for selectively turning off the first and second switch devices to generate the PDM output signal at a tri-state voltage between the first and second voltages, or turning on the first or second switch device to generate the PDM output signal at the first or second voltage, respectively,
wherein the control circuit module receives a sign bit for determining if the PDM output signal switches between the tri-state voltage and the first voltage, or between the tri-state voltage and the second voltage.

9. The tri-state pulse density modulator of claim 8 wherein the first and second switch devices a PMOS transistor and an NMOS transistors, respectively.

10. The tri-state pulse density modulator of claim 9 wherein the control circuit module comprises a first AND gate having an output node connected to the gate of the second switch device, and a first input node receiving the carry signal and a second input node receiving the sign bit.

11. The tri-state pulse density modulator of claim 8 wherein the control circuit module comprises an inverter for receiving the sign bit and outputting a reversed sign bit.

12. The tri-state pulse density modulator of claim 11 wherein the control circuit module further comprises a second AND gate having an output node connected to the gate of the first switch device, and a first input node receiving the carry signal and a second input node receiving the reversed sign bit.

13. The tri-state pulse density modulator of claim 8 further comprising a first resistor and a second resistor serially coupled between the first voltage and the second voltage, a connecting node between the first and second resistors being connected to a connecting node between the first and second switch devices, thereby maintaining the PDM output signal at the tri-state voltage when the first and second switches are turned off.

14. A method for generating a pulse density modulation (PDM) output signal, comprising:
generating a carry signal having a pulse density representing an PDM input signal;
generating a sign bit signal indicating the polarity of the PDM output signal; and
generating one or more control signals responsive to the carry signal and the sign bit signal for controlling a first switch device coupled to a first voltage, and a second switch device serially coupled between the first switch device and a second voltage that is lower than the first voltage,
wherein the control signals selectively turn off the first and second switch devices to generate the PDM output signal at a tri-state voltage between the first and second voltages, or turn on the first or second switch device to generate the PDM output signal at the first or second voltage, respectively, so that the PDM output signal only switches between the tri-state voltage and either the first voltage or the second voltage.

15. The method of claim 14 wherein when the sign bit signal is logic "0" and the carry signal is logic "0," the control signals turn off the first and second switch devices, so that the PDM output signal is at the tri-state voltage.

16. The method of claim 14 wherein when the sign bit signal is logic "0" and the carry signal is logic "1," the control signals turn on the first switch device and turn off the second switch device, so that the PDM output signal is at the first voltage.

17. The method of claim 14 wherein when the sign bit signal is logic "1" and the carry signal is logic "0," the control signals turn off the first and second switch devices, so that the PDM output signal is at the tri-state voltage.

18. The method of claim 14 wherein when the sign bit signal is logic "1" and the carry signal is logic "1," the control signals turn off the first switch device and turn on the second switch device, so that the PDM output signal is at the second voltage.

* * * * *